(12) United States Patent
Lee et al.

(10) Patent No.: US 9,112,128 B2
(45) Date of Patent: Aug. 18, 2015

(54) LIGHT EMITTING DEVICE MODULE AND LIGHTING SYSTEM INCLUDING THE SAME

(75) Inventors: Gun Kyo Lee, Seoul (KR); Byung Soo Ryu, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 476 days.

(21) Appl. No.: 13/242,328

(22) Filed: Sep. 23, 2011

(65) Prior Publication Data

US 2012/0012881 A1    Jan. 19, 2012

(30) Foreign Application Priority Data

May 4, 2011   (KR) ........................ 10-2011-0042253

(51) Int. Cl.
  *H01L 33/00*   (2010.01)
  *H01L 33/64*   (2010.01)
  *H01L 33/48*   (2010.01)
  *H01L 33/62*   (2010.01)
  *H05K 1/18*    (2006.01)

(52) U.S. Cl.
  CPC .............. *H01L 33/642* (2013.01); *H01L 33/48* (2013.01); *H01L 33/64* (2013.01); *H01L 33/486* (2013.01); *H01L 33/62* (2013.01); *H01L 2224/48137* (2013.01); *H01L 2224/48227* (2013.01); *H05K 1/181* (2013.01); *H05K 2201/09072* (2013.01); *H05K 2201/10106* (2013.01)

(58) Field of Classification Search
  CPC .......... H01L 33/64; H01L 33/48; H01L 33/54
  See application file for complete search history.

(56) References Cited

U.S. PATENT DOCUMENTS

| | | | |
|---|---|---|---|
| 7,499,288 B2 * | 3/2009 | Tanaka et al. | 361/767 |
| 7,777,238 B2 * | 8/2010 | Nishida et al. | 257/88 |
| 2005/0073846 A1 * | 4/2005 | Takine | 362/296 |
| 2005/0230692 A1 * | 10/2005 | Kim et al. | 257/79 |
| 2006/0006405 A1 * | 1/2006 | Mazzochette | 257/99 |
| 2007/0007540 A1 * | 1/2007 | Hashimoto et al. | 257/94 |
| 2009/0039382 A1 * | 2/2009 | Su | 257/99 |

* cited by examiner

*Primary Examiner* — Su C Kim
(74) *Attorney, Agent, or Firm* — KED & Associates LLP

(57) ABSTRACT

Disclosed herein is a semiconductor light emitting device module comprising: a substrate; at least one support disposed on a surface of the substrate; a heat transfer member disposed on the substrate and the support, the heating transfer member having a cavity formed in at least a portion of the heat transfer member; first conductive layer and second conductive layer contacting the heat transfer member via an insulating layer, the first conductive layer and the second conductive layer being electrically isolated from each other in accordance with exposure of the insulating layer or exposure of the heat transfer member; and at least one semiconductor light emitting device electrically connected to the first conductive layer and the second conductive layer, the at least one semiconductor light emitting device is thermally contacted an exposed portion of the heat transfer member.

15 Claims, 24 Drawing Sheets

B - B'

C - C'

LIGHT EMITTING DEVICE MODULE AND LIGHTING SYSTEM INCLUDING THE SAME

This application claims the benefit of Korean Patent Application No. 10-2011-0042253, filed on May 4, 2011 which is hereby incorporated in its entirety by reference as if fully set forth herein.

BACKGROUND OF THE INVENTION

1. Field of the Invention

Embodiments relate to a light emitting device module and a lighting system including the same.

2. Discussion of the Related Art

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light having high efficiency using fluorescent materials or through color mixing. Further, the light emitting devices have advantages, such as low power consumption, semi-permanent lifespan, fast response time, safety, and environmentally friendly properties as compared to conventional light sources, such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles and traffic lights.

Light emitting device modules are widely used in lighting apparatuses and display apparatuses. Such a light emitting device module is mounted in a package body such that they are electrically connected.

SUMMARY OF THE INVENTION

Accordingly, the embodiments are directed to a light emitting device module and a lighting system including the same, which are capable of achieving an improvement in optical efficiency.

Additional advantages, objects, and features of the embodiments will be set forth in part in the description which follows and in part will become apparent to those having ordinary skill in the art upon examination of the following or may be learned from the embodiments. The objectives and other advantages of the embodiments may be realized and attained by the structure particularly pointed out in the written description and claims hereof as well as the appended drawings.

To achieve this object and other advantages and in accordance with the purpose of the embodiments, as embodied and broadly described herein, a light emitting device module includes a substrate, at least one support disposed on a surface of the substrate, a heat transfer member disposed on the substrate and the support, the heating transfer member having a cavity formed in at least a portion of the heat transfer member, first conductive layer and second conductive layer contacting the heat transfer member via an insulating layer, the first conductive layer and the second conductive layer being electrically isolated from each other in accordance with exposure of the insulating layer or exposure of the heat transfer member, and at least one light emitting device electrically connected to the first conductive layer and the second conductive layer, contacting the at least one light emitting device is thermally contacted an exposed portion of the heat transfer member.

At least a portion of the support may contact the heat transfer member.

The substrate may be a bracket included in a lighting apparatus or a backlight unit.

The support may include a pattern formed at the bracket.

The pattern may include patterns respectively formed at the surface of the substrate contacting the heat transfer member and an opposite surface of the substrate.

The support may include a heat transfer layer formed on the substrate. The cross-sectional area of the support may be greatest in a side closest to the substrate.

The light emitting device module may further include at least one circuit board disposed on the heat transfer member.

The support may be disposed to correspond to the circuit board.

The support may support the heat transfer member outside the cavity.

At least two support may support the heat transfer member in at least two regions outside the cavity.

The support may have a trapezoidal shape.

In another aspect of the embodiments, a light emitting device module includes a heat transfer member having a cavity formed in at least a portion of the heat transfer member, at least one support for supporting the heat transfer member outside the cavity, first conductive layer and second conductive layer contacting the heat transfer member via an insulating layer, the first conductive layer and the second conductive layer being electrically separated from each other in accordance with exposure of the insulating layer or exposure of the heat transfer member, at least one light emitting device electrically connected to the first conductive layer and the second conductive layer, the at least one light emitting device is thermally contacted an exposed portion of the heat transfer member, and at least one circuit board disposed on the heat transfer member, the circuit board corresponds to the support.

At least two support may support the heat transfer member in at least two regions outside the cavity.

At least a portion of the support may contact the heat transfer member.

The support may include a heat transfer layer.

The support may have a trapezoidal shape.

In another aspect of the embodiments, a lighting system includes a light emitting device module including a substrate, at least one support disposed on a surface of the substrate, a heat transfer member disposed on the substrate and the support, the heating transfer member having a cavity formed in at least a portion of the heat transfer member, first conductive layer and second conductive layer contacting the heat transfer member via an insulating layer, the first conductive layer and the second conductive layer being electrically separated from each other in accordance with exposure of the insulating layer or exposure of the heat transfer member, and at least one light emitting device electrically connected to the first conductive layer and the second conductive layer, the at least one light emitting device is thermally contacted an exposed portion of the heat transfer member, a circuit board for supplying current to the light emitting device module, and an optical member for transmitting light emitted from the light emitting device module.

The substrate may be a bracket. The circuit substrate may correspond to the support. The optical member may be a light guide plate included in a backlight unit.

The substrate may be a bracket. The bracket may contact a heat dissipation unit included in a lighting apparatus.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1A:
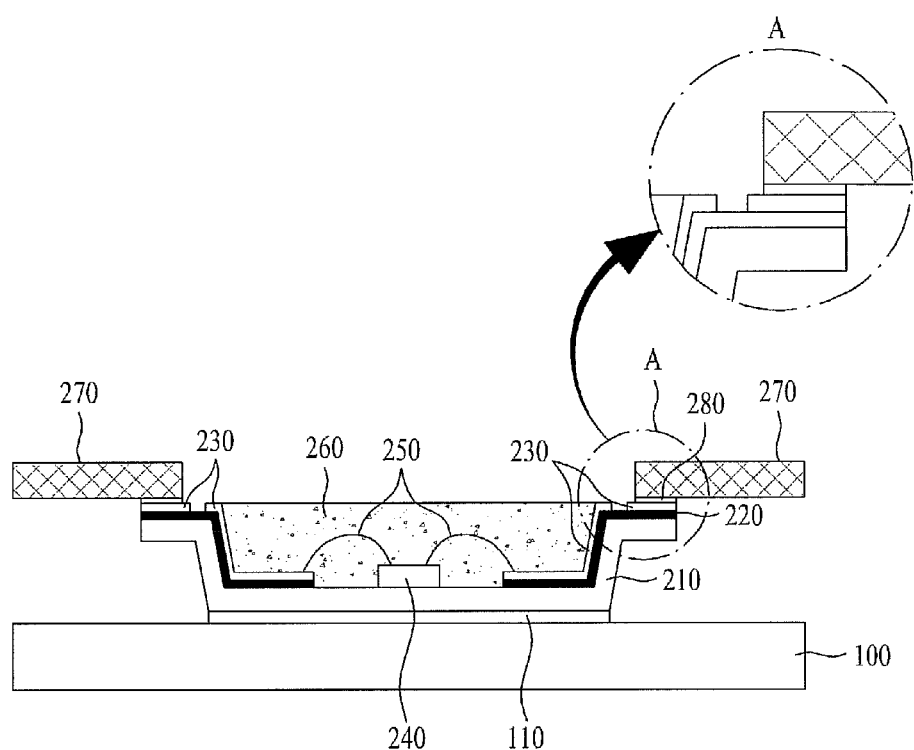
FIGS. 1A and 1B are sectional views illustrating light emitting device modules according to first and second embodiments, respectively.

Reference will now be made in detail to the preferred embodiments, examples of which are illustrated in the accompanying drawings.

In the following description of the embodiments, it will be understood that, when an element such as a layer (film), region, pattern, or structure is referred to as being "on" or "under" another element, it can be "directly" on or under another element or can be "indirectly" formed such that an intervening element may also be present. Also, terms such as "on" or "under" should be understood on the basis of the drawings.

In the drawings, dimensions of layers are exaggerated, omitted or schematically illustrated for clarity and description convenience. In addition, dimensions of constituent elements do not entirely reflect actual dimensions thereof.

Figure 1B:
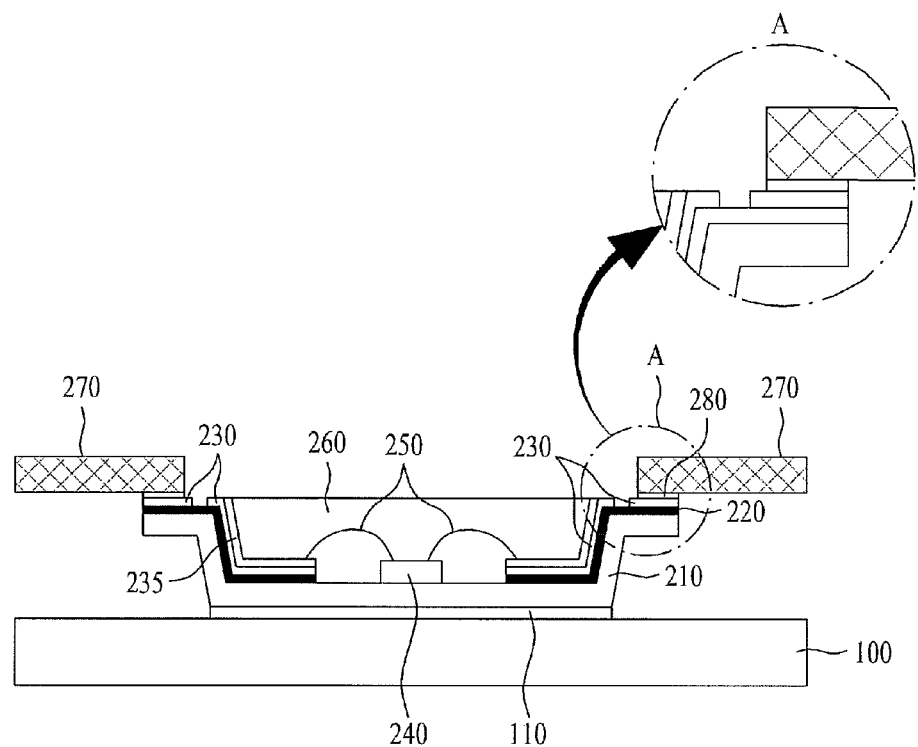

FIGS. 1A and 1B illustrate light emitting device modules according to first and second embodiments, respectively.

In the light emitting device module according to each embodiment, a light emitting device 240 is disposed in a cavity formed at a heat transfer member 210. The light emitting device 240 may include a vertical light emitting device, a horizontal light emitting device, or a flip-chip type light emitting device. In these embodiments or other embodiments, the light emitting device 240 may be semiconductor light emitting device, for example light emitting diode. The heat transfer member 210 may be made of a material having excellent thermal conductivity. For example, copper (Cu) or aluminum may be used for the material of the heat transfer member 210.

The light emitting device 240 may be disposed on a bottom of the cavity formed at the heat transfer member 210. The cavity may have side walls extending vertically. In the illustrated embodiments, the side walls of the cavity are outwardly inclined as they extend upwardly such that the width of the cavity is increased as the cavity extends upwardly, when viewing in the drawings.

Although the heat transfer member 210, which defines the cavity, is illustrated as being sharply bent, it may be bent in a streamlined shape.

An insulating layer 220 is formed over the heat transfer member 210. The insulating layer 220 may be made of, for example, polyimide. The insulating layer 220 may be patterned to expose at least a portion of the heat transfer member 210 at the bottom of the cavity. That is, the insulating layer 220 may not be formed on at least a portion of the bottom of the cavity.

A first conductive layer 230a and a second conductive layer 230b are formed such that the insulating layer 220 is interposed between the heat transfer member 210 and the first conductive layer 230a and the second conductive layer 230b. In accordance with this structure, the first conductive layer 230a the and second conductive layer 230b, which supply current to the light emitting device 240, are electrically insulated from the heat transfer member 210 by the insulating layer 220. This will be described later The first conductive layer 230a and the second conductive layer 230b may have the same shape as the insulating layer 220. However, each of the first conductive layer 230a and the second conductive layer 230b may be formed to have an open region at a portion thereof adjacent to a circuit board 270, so as to expose a portion of the insulating layer 220. This will be described later. The first conductive layer 230a and the second conductive layer 230b may be made of a copper foil.

The light emitting device 240 is electrically connected to the first conductive layer 230a and the second conductive layer 230b. This electrical connection may be achieved through bonding of wires 250 as in the illustrated embodiments. A resin layer 260 fills the cavity to protect the light emitting device 240 and wires 250. A fluorescent substance is contained in the resin layer 260. Accordingly, it may be possible to vary the wavelength of light emitted from the light emitting device 240.

A portion of the heat transfer member 210 extends horizontally at a region around a top of the cavity. A circuit board 270 is connected to the horizontal portion of the heat transfer member 210 via the insulating layer 220 and the first conductive layer 230a and the second conductive layer 230b.

The circuit board 270 may be coupled to the first conductive layer 230a and the second conductive layer 230b by a conductive adhesive 280. The circuit board 270 may include a printed circuit board (PCB), a metal PCB (MPCB), or a metal core PCB (MCPCB).

As shown in a portion "A" of FIG. 1A, the insulating layer 220 is partially exposed in a region between the cavity and the circuit board 270. That is, the first conductive layer 230a and the second conductive layer 230b are not formed in the above-described region such that they are opened in the region to expose a portion of the insulating layer 220 corresponding to the region. In this case, the conductive adhesive 280 may also not be formed on the exposed portion of the insulating layer.

In the embodiment of FIG. 1B, a reflective layer 235 is formed on the first conductive layer 230a and the second conductive layer 230b within the cavity. The reflective layer 235 may be made of a material capable of reflecting light emitted from the light emitting device 240 in order to send the reflected light to an outside of the cavity. A silver (Ag) may be coated over the reflective layer 235.

The heat transfer member 210 may be coupled to a substrate 100 via an adhesive layer 110. The substrate 100 may function as a body of the light emitting device module. When the substrate 100 is made of a metal, it may function as a bracket to support a light source module in a backlight unit or a lighting apparatus.

The adhesive layer 110 has excellent thermal conductivity. The adhesive layer 110 may bond the heat transfer member 210 to the substrate 100. When the substrate 100 is made of a metal to function as a bracket, heat emitted from the light emitting device 240 is directly transferred to the substrate 100 because it is unnecessary to use a resin such as polyphthalamide (PPA) in the backlight unit or lighting apparatus.

Figure 2:
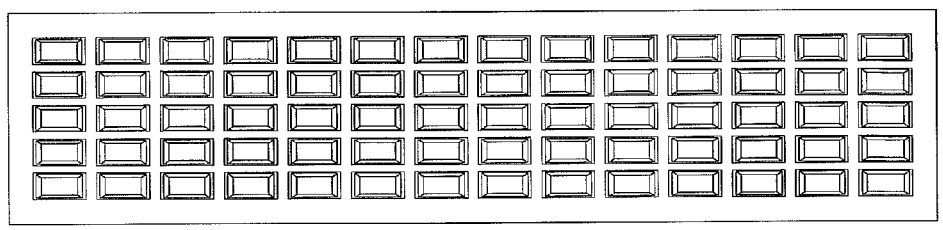
FIGS. 2 and 3 are plan views illustrating light emitting device arrays according to different embodiments.
Figure 3:
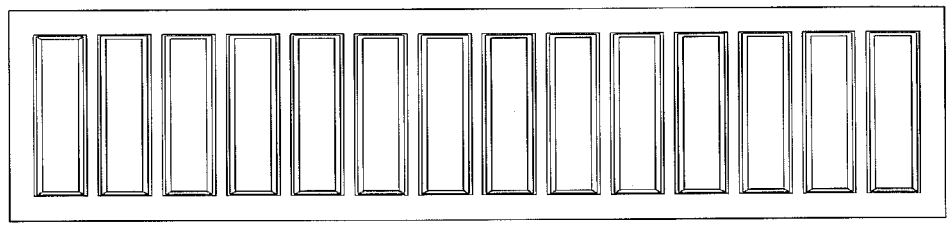

FIGS. 2 and 3 are views illustrating light emitting device module arrays according to exemplary embodiments, respectively.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member. FIG. 2 is a view illustrating a state in which the light emitting device array has not been separated into individual light emitting device modules. FIG. 3 illustrates a structure in which a plurality of light emitting devices can be disposed in each cavity.

Figure 4:
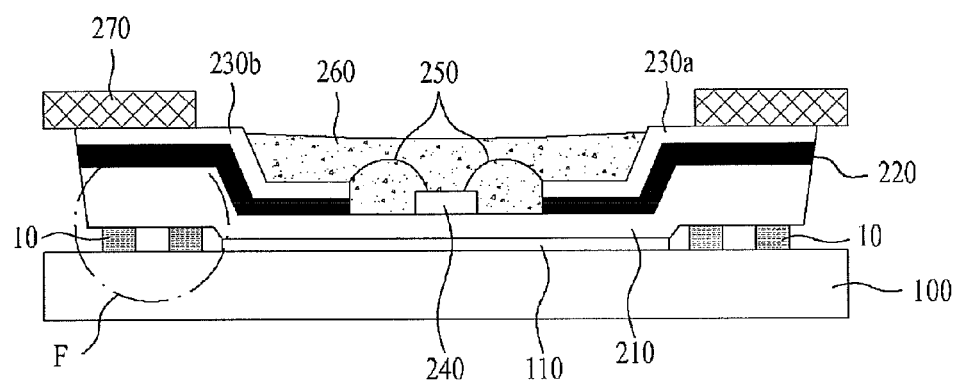
FIG. 4 is a sectional view illustrating a light emitting device module according to a third embodiment.

FIG. 4 is a sectional view illustrating a light emitting device module according to a third embodiment.

The light emitting device module according to this embodiment is similar to that of FIG. 1, except that the heat transfer member 210 has a step due to formation of a cavity, so that it is spaced apart from the substrate 100 in a region corresponding to the circuit board 270, and a support 10 is formed at the substrate 100 to withstand the weight of the circuit board 270, etc in the region.

Figure 5A:
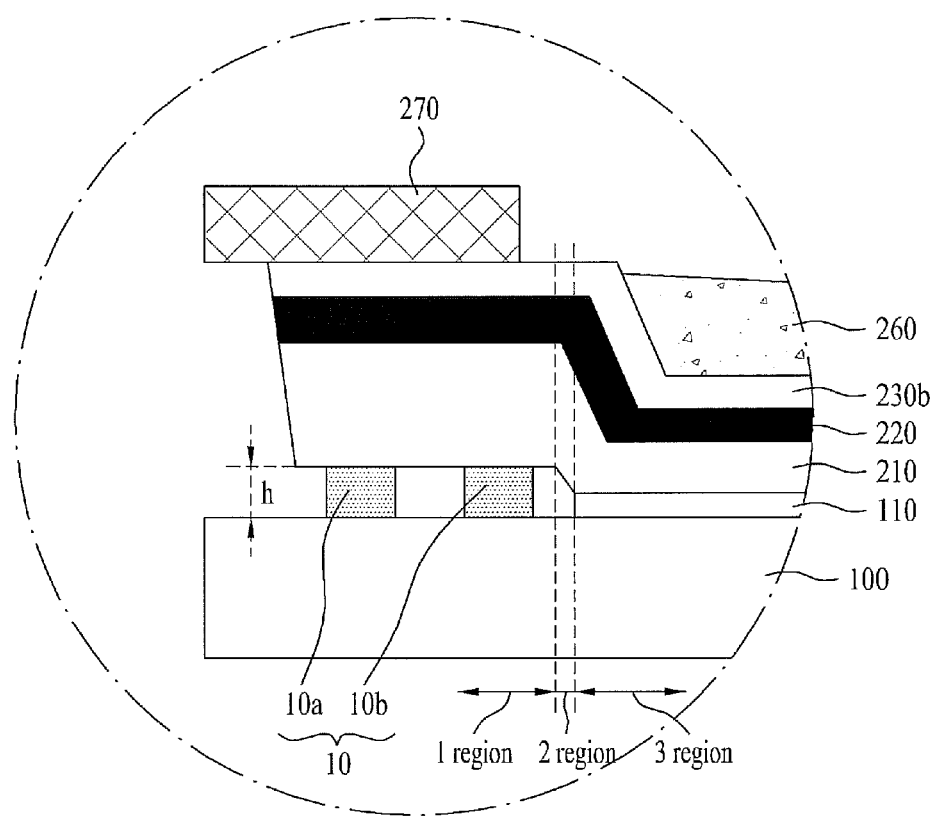
FIG. 5A is an enlarged view corresponding to a portion "F" of FIG. 4.

FIG. 5A is an enlarged view corresponding to a portion "F" of FIG. 4.

Referring to FIG. 32A, the support 10 is formed at the substrate 100 in the region corresponding to the circuit board 270 in order to support the heat transfer member 210. Practically, in one light emitting device module, supports 10 are provided in regions at opposite sides of the cavity, respectively. For simplicity of description, the following description will be given only in conjunction with the support 10 provided in the region at one side of the cavity.

The support 10 is disposed on the substrate 100 in a region where the heat transfer member 210 does not contact the substrate 100. Referring to FIG. 32A, three regions, namely, first to three regions, are defined. In the third region, the substrate 100 contacts the heat transfer member 210 via the adhesive layer 110. Accordingly, it is unnecessary to dispose the support 10 in the third region.

In the second region, the heat transfer member 210 has an inclination. This inclination is caused by the fact that the heat transfer member 210 has different heights in a region where the cavity is formed and a region where the circuit board is disposed, while extending horizontally in the regions.

In the first region, the heat transfer member 210 is spaced apart from the substrate 100 by a certain distance. To this end, in the first region, the support 10 is formed on the substrate to contact the heat transfer member 210, and thus to support the heat transfer member 210. In this case, the support receives a load applied from the circuit board 270 to the heat transfer member 210. Therefore, at least a portion of the support 10 should contact the heat transfer member 210.

In the case of FIG. 5A, the support 10 includes a first support portion 10a and a second support portion 10b. The support 10 may include at least one support portion, taking into consideration the magnitude of load and the width of the first region. The support 10 may be formed of an elastic member to withstand the above-described load. The support 10 may also be made of a heat transferable material to function as a heat transfer layer capable of transferring heat generated from the circuit board 270 to the substrate 100, which is made of a metal material. Such configurations may also be applied to the embodiments, which will be described later.

The height h of the support 10 may be equal to the sum of the height difference in the heat transfer member 210 and the height of the adhesive layer 110.

FIGS. 5B to 5G are enlarged views corresponding to the portion "F" of FIG. 4 to illustrate different embodiments from that of FIG. 5A.

Figure 5B:
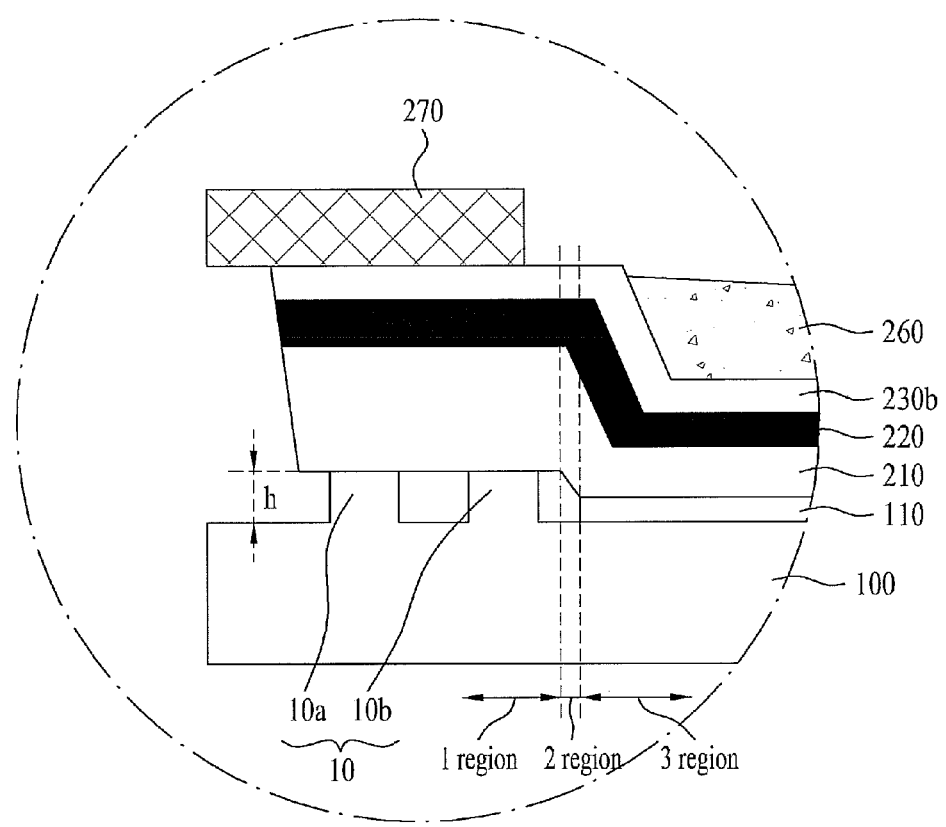
FIGS. 5B to 5G are enlarged views corresponding to the portion "F" of FIG. 4 to illustrate different embodiments from that of FIG. 5A.

In the embodiment of FIG. 5B, the support 10 is formed in accordance with patterning of the substrate 100 in the region where the substrate 100 does not contact the heat transfer member 210, namely, the first region. That is, in this embodiment, the support 10 is made of the same material as the substrate 100. In this case, the substrate 100 is made of a metal, so that it may be possible to increase the area of the substrate 100 to absorb heat emitted from the circuit board 270.

Similarly to the previous embodiment, the support 10 may include a first support portion 10a and a second support portion 10b in this embodiment. The support 10 may include at least one support portion, taking into consideration the magnitude of load and the width of the first region.

Figure 5C:
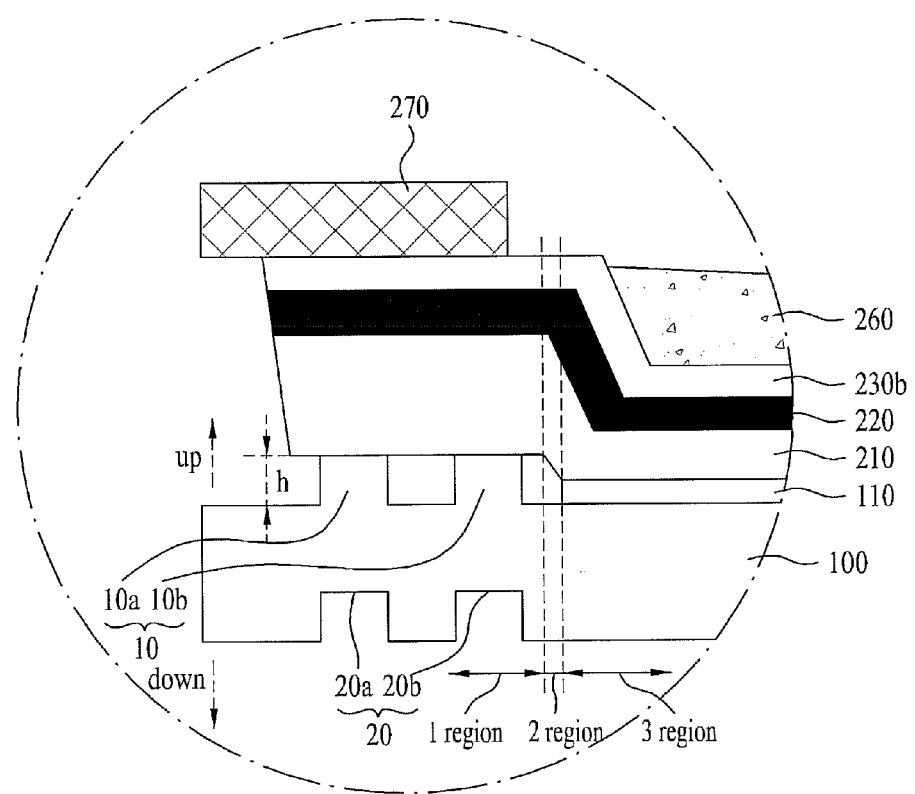

The embodiment of FIG. 5C is similar to the embodiment of FIG. 5B, except that the substrate 100 has the same pattern at the upper and lower surfaces thereof. That is, when it is assumed that the direction of the substrate 100 to face the heat transfer member 210 is a first direction of the substrate 100, and the direction opposite to the first direction is a second direction of the substrate 100, the substrate 100 has the same pattern in the first and second directions.

The embodiments of FIGS. 5B and 5C are different in terms of manufacturing processes. That is, in the case of FIG. 5B, the substrate 100 may be injection-molded to have the support 10, whereas, in the case of FIG. 5C, the substrate 100 is injection-molded without having the support 100, and then pressed to form the support 10.

Figure 5D:
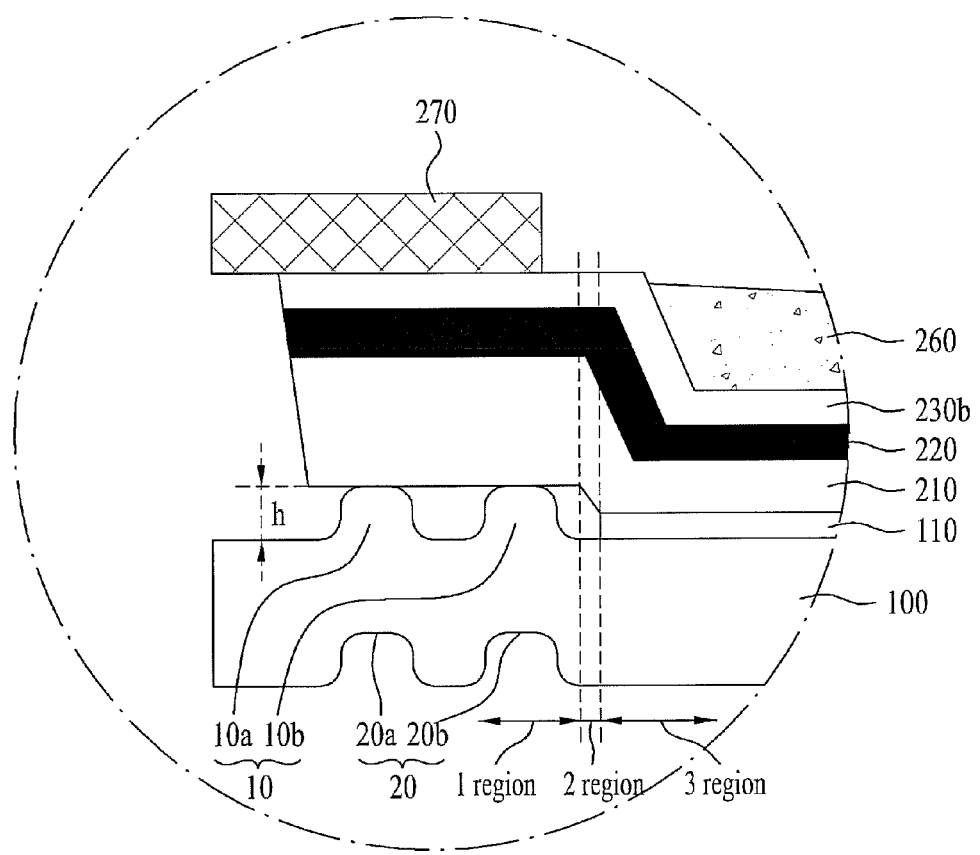

The embodiment of FIG. 5D is similar to the embodiment of FIG. 5C, except that the pattern forming the support 10 is subjected to a rounding process. That is, the support 10 has a round edge to prevent impact from being generated at a portion of the support 10 contacting the heat transfer member 210.

Figure 5E:
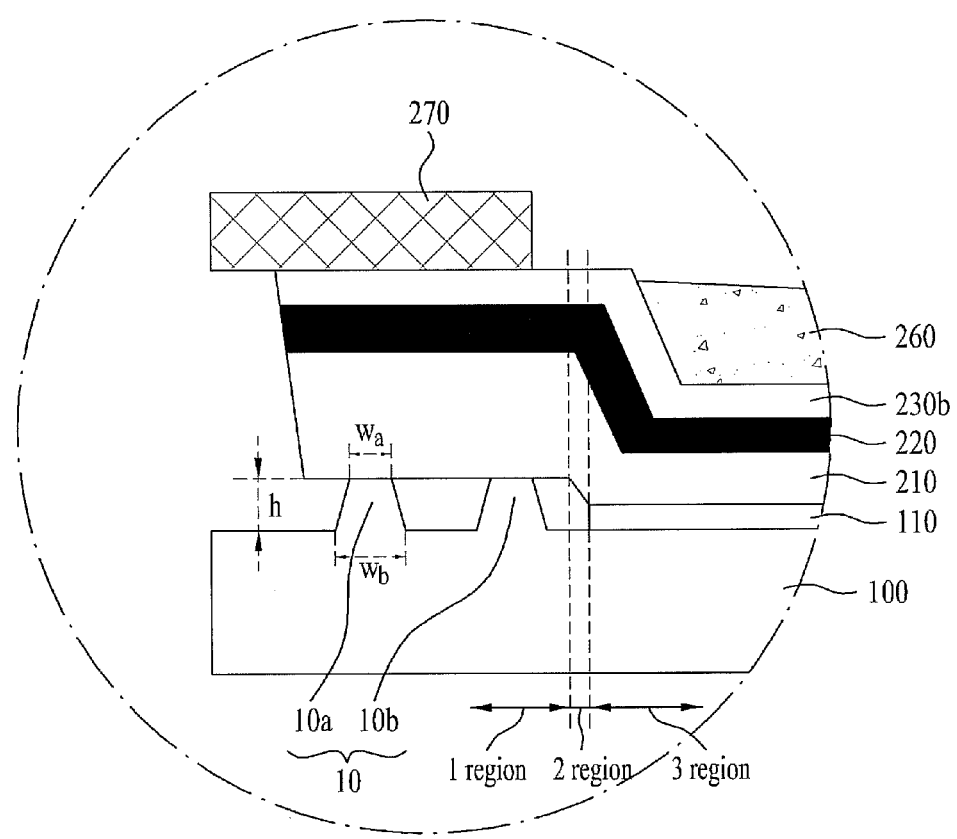
Figure 5F:
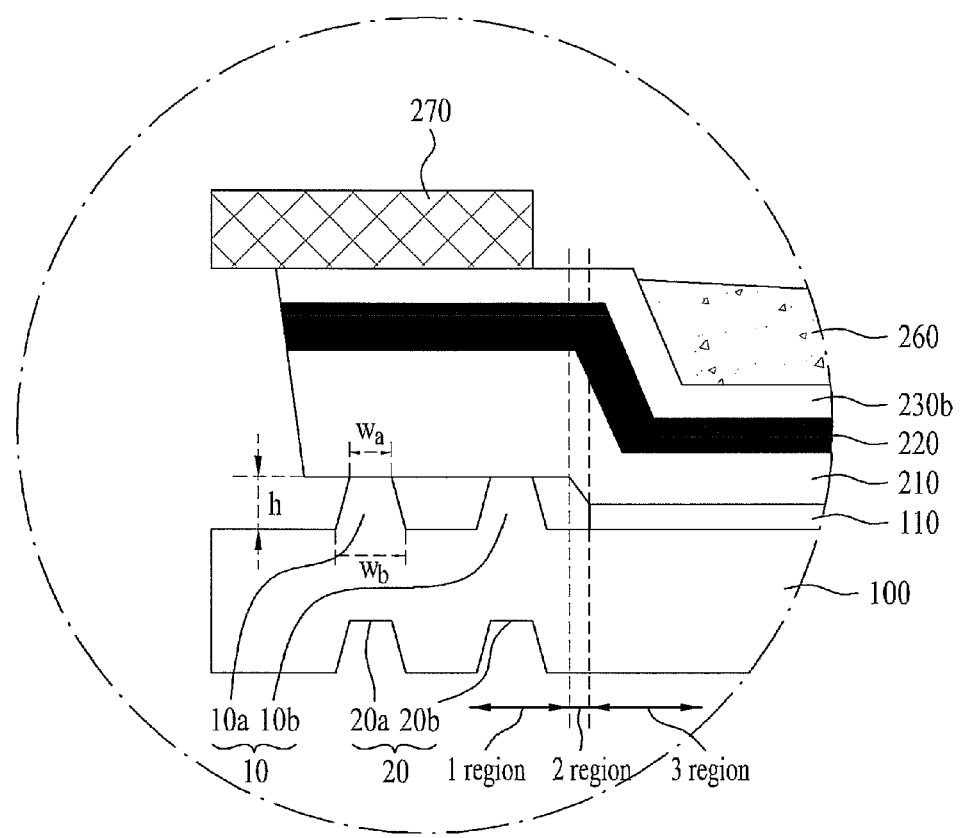
Figure 5G:
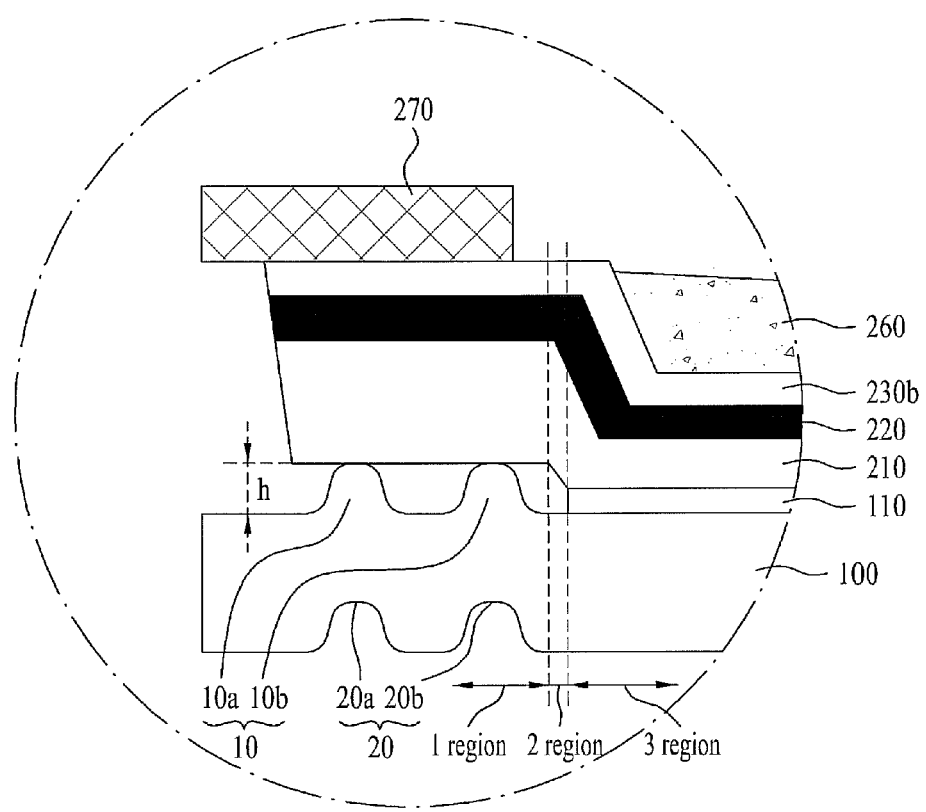

In each embodiment of FIGS. 5E to 5G, the support 10 is formed in accordance with patterning of the substrate 100. The size or area of the support 10 in the direction of the support 10 contacting the heat transfer member 210 is smaller than that of the support 10 in the direction of the support 10 contacting the substrate 100. For example, the support 10 has a shape similar to a trapezoidal shape. That is, the support 10 has a surface facing the heat transfer 210 member and another surface facing the substrate 100, the cross-sectional area of the surface facing the heat transfer member 210 is less than the cross-sectional area of the surface facing substrate 100.

The cross-sectional area of the support 10 may be greatest in a side closest to the substrate 100. And, the cross-sectional area of the support 10 may be decreased in corresponding to a distance from the substrate 100.

In the above-described structure, the support 10, which has a trapezoidal shape, stably supports the heat transfer member 210. The support 10 may be protruded from the substrate 100, as in the structure of FIG. 5A. The support 10 may also be formed by pressing the substrate 100 after injection molding thereof to respectively form patterns at two surfaces of the substrate 100, as in the structure of FIG. 5F. Alternatively, the patterns of the substrate 100 in the structure of FIG. 32F may be subjected to a rounding process to form the structure of FIG. 5G.

FIGS. 6A to 6I are views illustrating a method for manufacturing the light emitting device module of FIG. 4 in accordance with an exemplary embodiment.

Figure 6A:
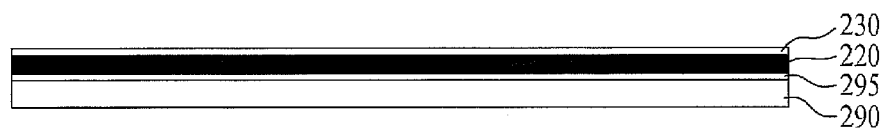
FIGS. 6A to 6I are views illustrating a method for manufacturing the light emitting device module of FIG. 4 in accordance with an exemplary embodiment.

In accordance with the illustrated method, as shown in FIG. 6A, the insulating layer 220 and a conductive layer 230 are first formed over a base substrate 290. In this case, the insulating layer 220 may be fixed to the base substrate 290 by an adhesive 295.

For the conductive layer 230, which is bonded to the insulating layer 220, a copper foil, to which a polyimide film is bonded, may be used. Since the polyimide film has a small thickness of, for example, 5 μm, it is very advantageous in terms of thermal resistance.

Figure 6B:
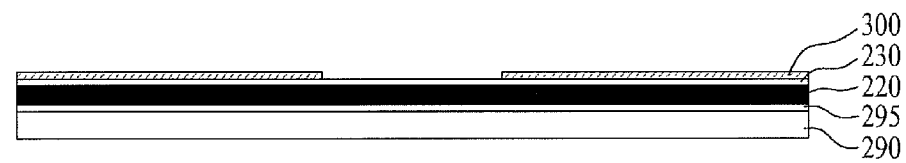

As shown in FIG. 6B, a mask 300 is selectively formed on the conductive layer 230. Using the mask 300, the conductive layer 230 and insulating layer 220 are subsequently patterned. In this case, the conductive layer 230 may be divided into two portions, namely, the first conductive layer 230a and the second conductive layer 230b.

Figure 6C:
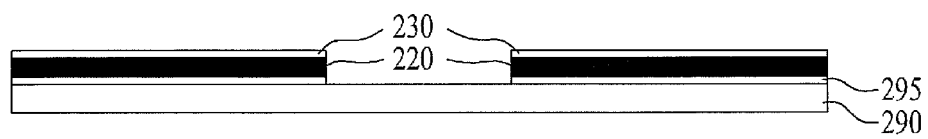

The middle region of FIG. 6C, from which the insulating layer 220, etc. are removed, corresponds to the bottom of the cavity in FIG. 4.

Figure 6D:
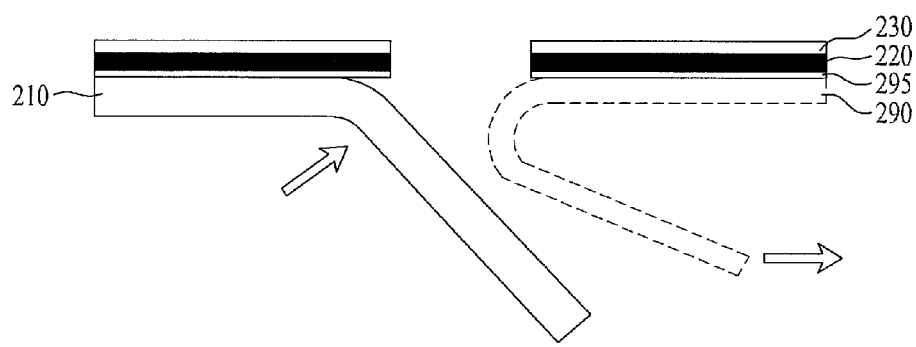

As shown in FIG. 6D, the base substrate 290 is then removed. Subsequently, the heat transfer member 210 is bonded to the insulating layer 220. In this case, the bonding may be achieved using the previously-coated adhesive 295 or an additional adhesive 295. The base substrate 290 is removed after functioning as a stiffener in the manufacturing procedure.

In this case, the insulating layer 220 and adhesive 295 form two layers between the heat transfer member 210 and each of the firs and second conductive layers 230a and 230b. Since the polyimide of the insulating layer 220 function as an electrical insulator, and the adhesive 295 performs a bonding function, an optimal structure capable of achieving an improvement in heat transfer characteristics may be obtained.

Since the heat transfer member 210, which has a metal structure thicker than the copper foil, supports the light emitting device 240, it may be possible to achieve a remarkable enhancement in reliability. It is also unnecessary to achieve an increase in stiffness using a transparent resin. Accordingly, the material of the resin layer may be selected from more various materials, and thus, cost reduction may be achieved.

Furthermore, it may be possible to achieve a great enhancement in heat dissipation characteristics in accordance with a combination of the insulating layer 220 and adhesive 295. For example, when only the insulating layer 220, which is made of polyimide, is applied between each of the first conductive layer 230a and the second conductive layer 230b, which is made of a copper foil having a thickness of, for example, 18 μm, and the heat transfer member 210, which is made of a copper foil having a thickness of 125 μm, the insulating layer 220 is required to have a thickness of, for example, 20 to 30 μm, when tolerance and bonding force are taken into consideration.

However, when the insulating layer 220 is applied along with the adhesive 295, it may be possible to reduce the thickness of the polyimide insulating layer 220. This may be achieved by thinly coating polyimide over the conductive layer 230 made of a copper foil, to form the insulating layer 220. Thus, the thickness of the polyimide insulating layer 220 may be reduced to 5 μm. Since the thin polyimide insulating layer 220, which has a thickness of 5 μm, provides insulation characteristics, the adhesive 295 may achieve an enhancement in thermal conductivity.

Figure 6E:
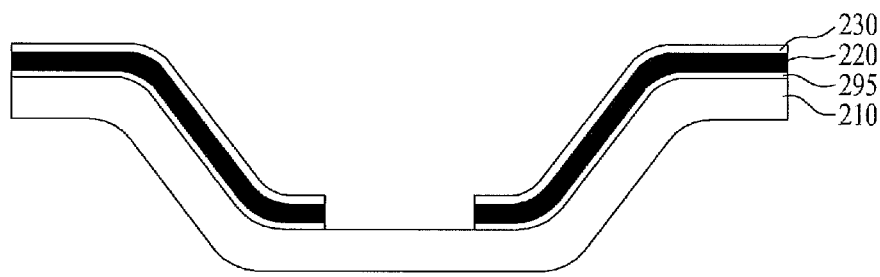

Thereafter, a pressure is applied to the edges of the heat transfer member 210 to form a step at the heat transfer member 210, as shown in FIG. 6E. At this time, the insulating layer 220 and the first conductive layer 230a and the second conductive layer 230b are also stepped in the same manner as the heat transfer member 210.

The above-described step may be formed using a method for pressing the heat transfer member 210 or the like. The step may be formed as the heat transfer member 210 is bent in a vertical direction or in a streamlined shape.

Thereafter, a pressure is applied to the heat transfer member 210 to bend the heat transfer member 210, and thus to form the cavity. At this time, the insulating layer 220 and the first conductive layer 230a and the second conductive layer 230b are also bent. The cavity may have a shape in which the edges of the cavity have a curved shape or a shape in which the edges of the cavity have a point of inflection, as shown in FIG. 3I.

The support, which will be described later, may have a height varying in accordance with the bending degree of the heat transfer member 210.

Figure 6F:
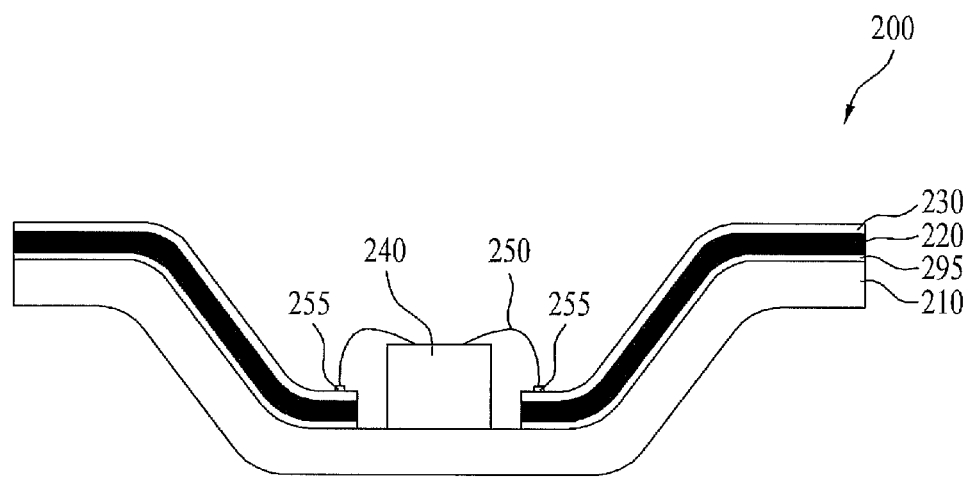

Subsequently, the light emitting device 240 is mounted on the bottom of the cavity, as shown in FIG. 6F. The light emitting device 240 is wire-bonded to the first conductive layer 230a and the second conductive layer 230b by the wires 250. In this case, electrode pads 255 may be formed on the first conductive layer 230a and the second conductive layer 230b. The wires 250 are bonded to the electrode pads 255.

Figure 6G:
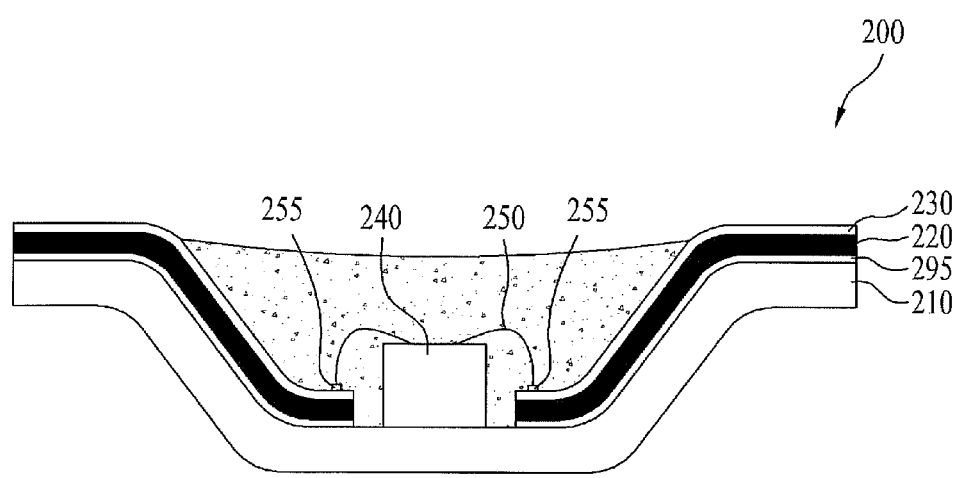
Figure 6H:
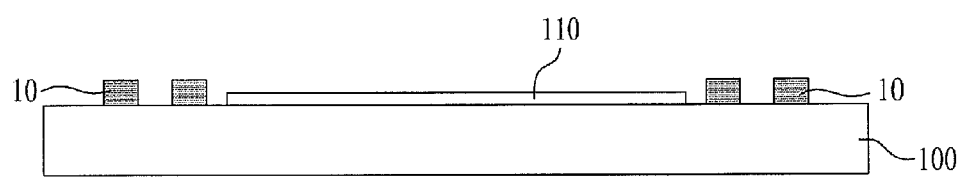

Thereafter, a resin layer 260 fills the cavity to protect the light emitting device 240 and wires 250, as shown in FIG. 6G. A fluorescent substance is contained in the resin layer 260. Accordingly, it may be possible to vary the wavelength of light emitted from the light emitting device 240.

Subsequently, the support 10 is prepared to be provided at the substrate 100, as shown in FIG. 66H. The support 10 may be prepared in the form of a separate member made of a material different from that of the substrate 100, as in this embodiment, or in the form of a structure integral with the substrate 100, as in other embodiments. An adhesive layer 110 is formed on the substrate 100 to bond the support 10 to the substrate 100.

Figure 6I:
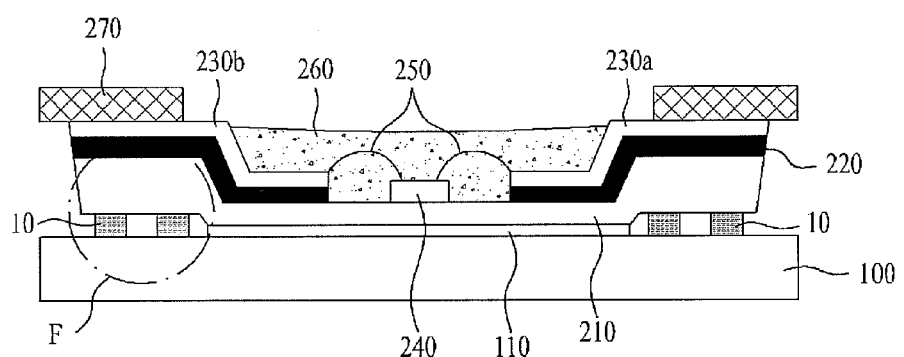

As shown in FIG. 6I, the heat transfer member 210 is boned to the substrate 100 by the adhesive layer 110 while coming into contact with the substrate 100 via the support 10. The shape in a portion "F" of FIG. 6I has been described with reference to FIG. 5A, etc.

FIGS. 7A to 7G are views illustrating a method for manufacturing the light emitting device module of FIG. 4 according to another embodiment of the present invention.

In this embodiment, the base substrate 290 is not used, different form the embodiment of FIG. 6A, etc. Also, the insulating layer 220 may be fixed to the heat transfer member 210 without using the adhesive 295. In this case, a material having a bonding property such as polyimide may be used for the insulating layer 220. In other embodiments, the adhesive 295 may be dispensed with.

Figure 7A:
FIGS. 7A to 7G are views illustrating a method for manufacturing the light emitting device module of FIG. 4 according to another embodiment.

First, the heat transfer member 210 is prepared, as shown in FIG. 7A. The heat transfer member 210 may be made of a material having excellent thermal conductivity. For example, copper (Cu) or aluminum (Al) may be used for the material of the heat transfer member 210.

Figure 7B:
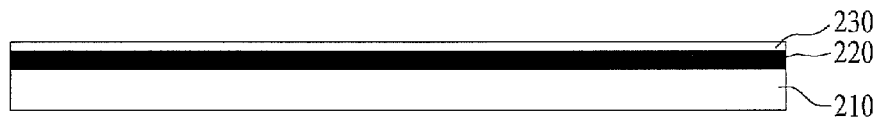

As shown in FIG. 7B, the insulating layer 220 and the conductive layer 230 are fixed on the heat transfer member 210 by the adhesive 295.

Figure 7C:
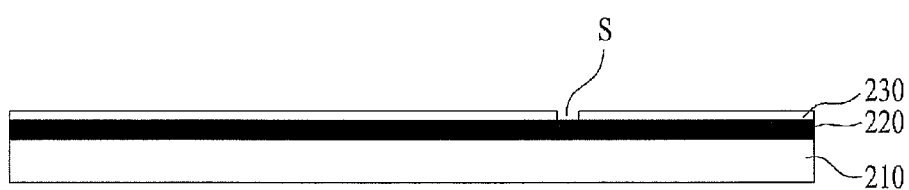

The conductive layer 230 is then patterned as shown in FIG. 7C. In this case, the conductive layer 230 is partially removed to partially expose the insulating layer 220. The conductive layer 230 is divided into first conductive layer 230a and the second conductive layer 230b by the region S where the insulating layer is exposed.

The process of partially removing the conductive layer 230 may be achieved using a mask, which is coated, as shown in FIG. 7B, etc., to selectively remove a portion of the conductive layer 230. Although opposite ends of the conductive layer 230 are not removed, namely, portions of the insulating layer 220 corresponding to the opposite ends are not exposed, in the illustrated embodiment, an open region, through which the insulating layer 220 is exposed, may be formed around the cavity, as shown in FIG. 7C, etc.

Figure 7D:
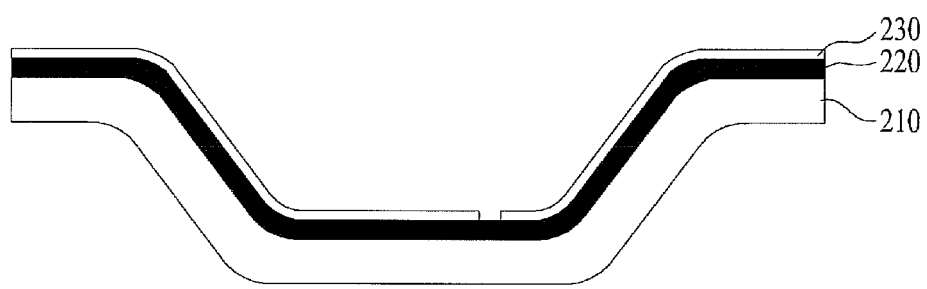

Thereafter, a pressure is applied to the heat transfer member 210 to bend the heat transfer member 210, and thus to define the cavity, as shown in FIG. 7D. At this time, the insulating layer 220 and the first conductive layer 230a and the second conductive layer 230b are also bent. The cavity may be formed to have a shape in which the edges of the cavity have a curved shape, or a shape in which the edges of the cavity have a point of inflection.

Figure 7E:
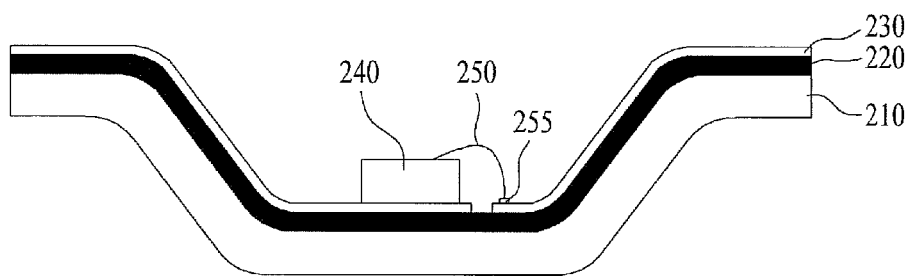

The reflective layer 235 is then formed over the first conductive layer 230a and the second conductive layer 230b, as shown in FIG. 7E. The reflective layer 235 may be made of a material capable of reflecting light emitted from the light emitting device 240 in order to send the reflected light to an outside of the cavity. A silver (Ag) may be coated over the reflective layer 235.

Figure 7F:
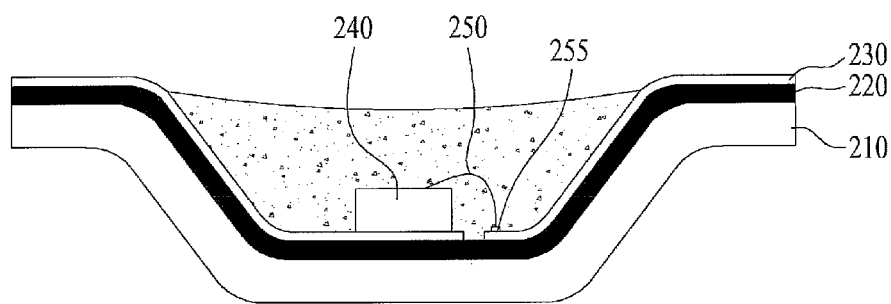

The light emitting device 240 is then disposed in the cavity of the heat transfer member 210. Thus, a light emitting device module as shown in FIG. 7F is completely obtained.

Figure 7G:
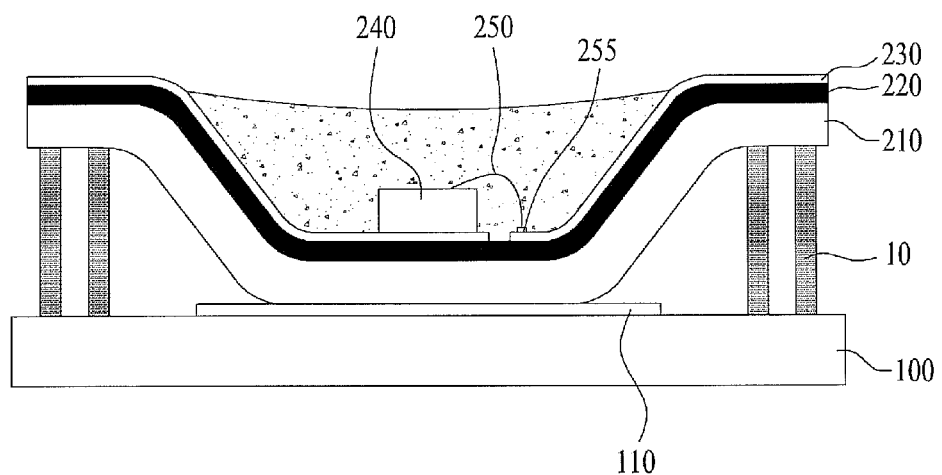

When the heat transfer member 210 of the light emitting device module is bonded to the substrate 100 by the adhesive layer 110, a light emitting device module as shown in FIG. 7G is completely obtained. Since it is unnecessary to form a package body using a polyphthalamide (PPA) resin, the effect of transferring heat emitted from the light emitting device 240 to the heat transfer member 210 is great.

In this case, the supports 10 are formed on the substrate 100 outside the cavity to support the load applied to the heat transfer member 210. As described above, circuit boards (not shown) may be arranged on the first conductive layer 230a and the second conductive layer 230b corresponding to the supports 10, respectively.

Figure 8:
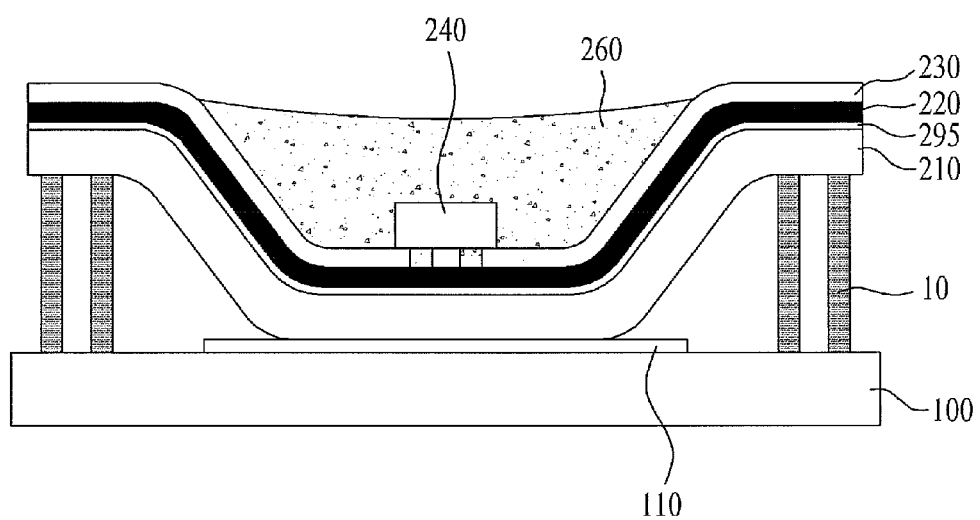
FIG. 8 is a sectional view illustrating a light emitting device module according to an fourth embodiment.

In a light emitting device module according to an eighteenth embodiment of FIG. 8, the light emitting device 240 is electrically connected to the first conductive layer 230a and the second conductive layer 230b without using wire bonding. That is, in this embodiment, the light emitting device 240 is of a flip-chip type so that it may be directly bonded to the first conductive layer 230a and the second conductive layer 230b.

The above-described light emitting device module may be manufactured from an array of light emitting devices. That is, such a light emitting device array may be separated into individual light emitting device modules after being subjected to a process in which an insulating layer, a conductive layer, etc. are laminated over the heat transfer member. Each of the separated light emitting device modules is then bonded to the bracket. Alternatively, the separation into the individual light emitting device modules may be achieved after the bonding of the heat transfer member to the bracket.

Figure 9:
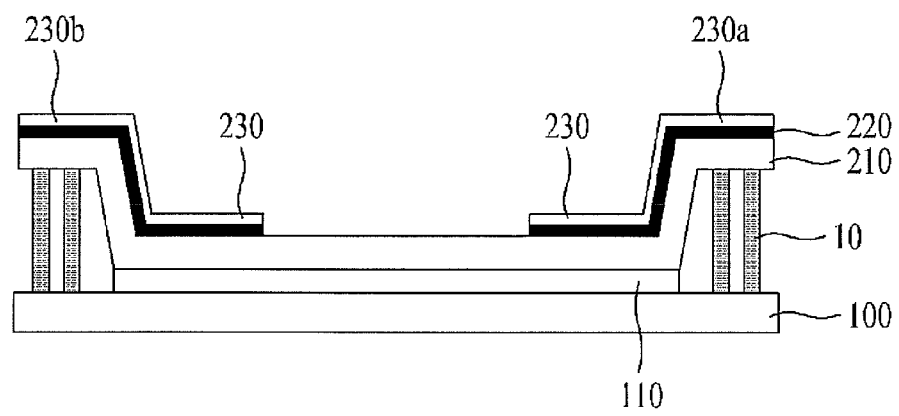
FIG. 9 shows cross-sectional views respectively taken in directions corresponding to a longer axis and a shorter axis in the light emitting device module of FIG. 4.
Figure 9:
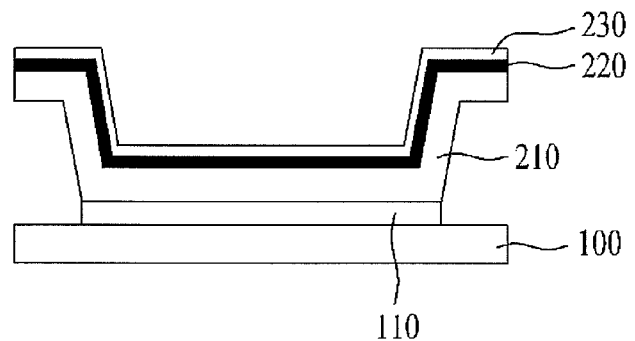

FIG. 9 shows cross-sectional views respectively taken in directions corresponding to a longer axis and a shorter axis in the light emitting device module of FIG. 4a. FIG. 9 omits illustration of the light emitting device, etc.

FIG. 9(B-B'), which is a cross-sectional view taken in the longer axis direction of the light emitting device module, shows exposure of the heat transfer member 210 in a central portion of the cavity. However, in FIG. 9(C-C'), which is a cross-sectional view taken in the shorter axis direction of the light emitting device module, the heat transfer member 210 is not exposed at the bottom of the cavity. That is, the heat transfer member 210 is exposed in a short-axis direction within the cavity.

Referring to FIG. 9(B-B'), the supports 10 are formed between the substrate 100 and the heat transfer member 210 to support the weights of the circuit boards 270, respectively. At the regions shown in FIG. 9(C-C'), however, the circuit boards 270 are not disposed, so that the supports 10 may not be provided at the regions.

Figure 10:
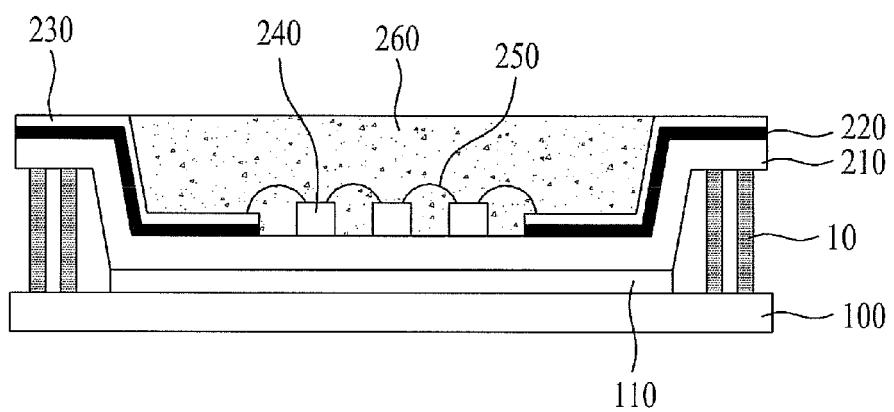
FIG. 10 is a sectional view illustrating a light emitting device module according to a fifth embodiment.

FIG. 10 is a sectional view illustrating a light emitting device module according to a fifth embodiment of the present invention.

In this embodiment, a plurality of light emitting devices 240 is disposed in the cavity. The light emitting devices are wire-bonded to one another by wires 250. The light emitting devices 240 arranged at opposite side edges of the cavity are wire-bonded to the first conductive layer 230a and the second conductive layer 230b by wires 250.

Similarly to the previous embodiments, the heat transfer member may be exposed at the central region C of the cavity. Each light emitting device 240 directly contacts the heat transfer member 210 exposed at the bottom of the cavity.

Circuit boards (not shown) may be disposed on the first conductive layer 230a and the second conductive layer 230b in regions outside the cavity, respectively. Supports 10 are disposed on the substrate 100 beneath the regions outside the cavity, respectively, to support the heat transfer member 210.

Figure 11:
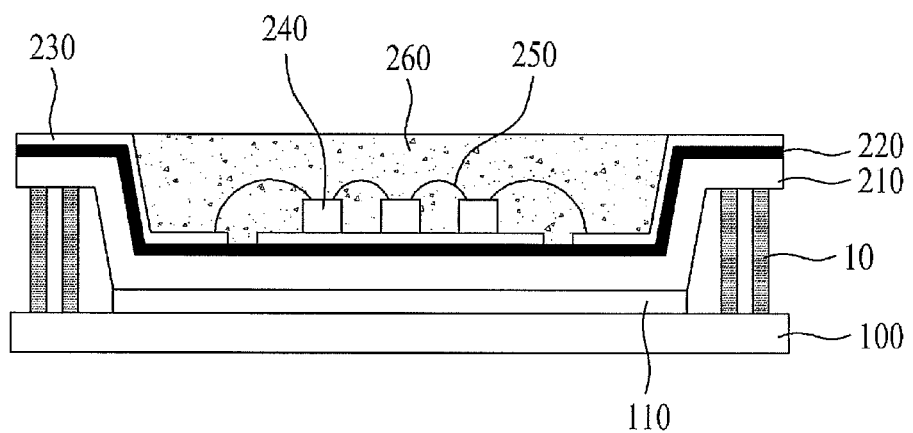
FIG. 11 is a sectional view illustrating a light emitting device module according to a sixth embodiment.

FIG. 11 is a sectional view illustrating a light emitting device module according to a sixth embodiment of the present invention.

This embodiment is similar to the embodiment of FIG. 10, except that the heat transfer member 210 is not exposed at the bottom of the cavity. That is, the insulating layer 220 and the first conductive layer 230a and the second conductive layer 230b are completely disposed on the heat transfer member 210 in a region corresponding to the bottom of the cavity where the light emitting devices 240 are disposed.

In order to avoid short of current supplied to each light emitting device 240, the first conductive layer 230a and the second conductive layer 230b are removed from a region C corresponding to a portion of the bottom of the cavity. Circuit boards (not shown) may be disposed on the first conductive layer 230a and the second conductive layer 230b in regions outside the cavity, respectively. Supports 10 are disposed on the substrate 100 beneath the regions outside the cavity, respectively, to support the heat transfer member 210.

Figure 12:
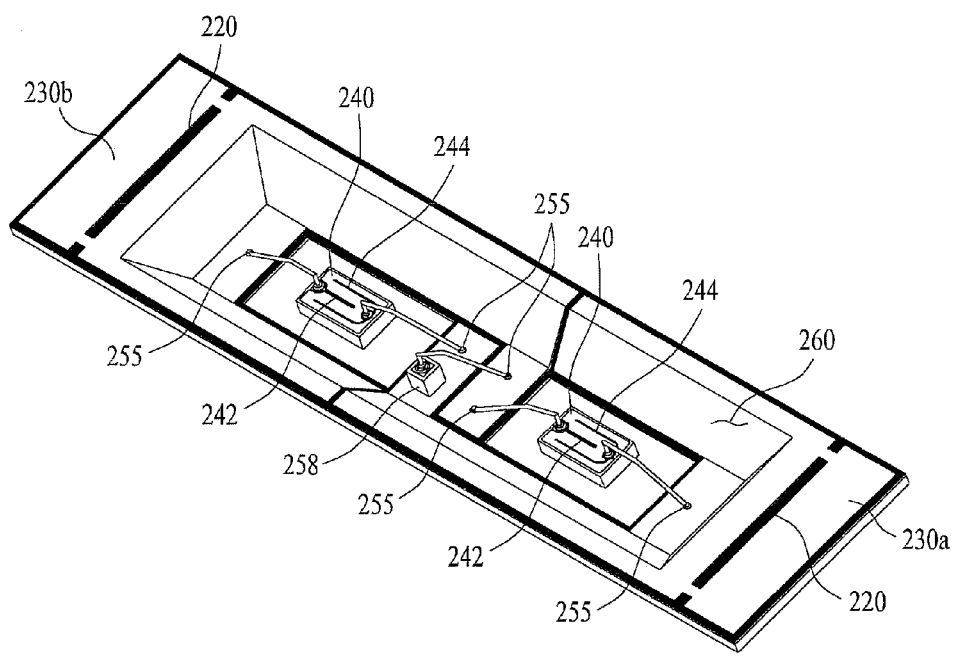
FIG. 12 is a perspective view illustrating a light emitting device module according to a seventh embodiment.

FIG. 12 is a perspective view illustrating a light emitting device module according to a seventh embodiment of the present invention.

In this embodiment, two light emitting devices 240 are disposed in the cavity. Wires are connected to two electrode pads 242 and 244 provided at each light emitting device 240, respectively. The two light emitting devices 240 are connected to the first conductive layer 230a and the second conductive layer 230b by wires, respectively. The light emitting devices 240 are electrically connected to each other via a third conductive layer 258, which is of an island type.

Electrode pads 255 are formed at each of the first conductive layer 230a and the second conductive layer 230b connected to respective light emitting devices 240 by wires. A resin layer 260 fills the cavity to protect the light emitting devices 240 and wires.

Similarly to the above-described embodiments, each of the first conductive layer 230a and the second conductive layer 230b is partially patterned in a region between the cavity and an external circuit board (not shown) to expose a portion of the insulating layer 220 in this embodiment.

Figure 13:
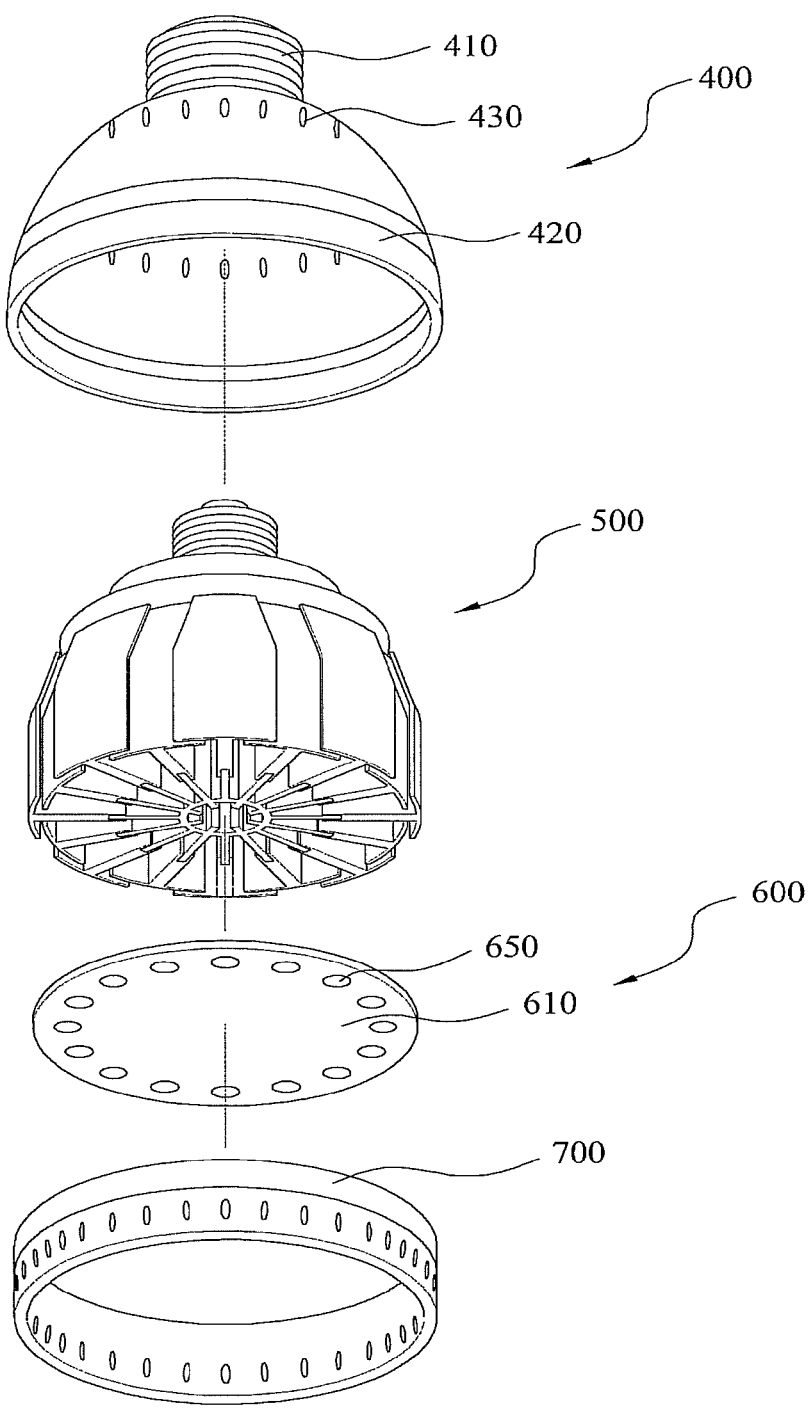
FIG. 13 is an exploded perspective view illustrating a lighting apparatus including the light emitting device module according to one of the above-described embodiments.

Hereinafter, a lighting apparatus and a backlight unit will be described as an embodiment of a lighting system in which one of the above-described light emitting device module is arranged. FIG. 13 is an exploded perspective view illustrating a lighting apparatus including the light emitting device module according to one of the above-described embodiments.

The lighting apparatus includes a light source 600 for projecting light, a housing 400 in which the light source 600 is mounted, a heat dissipation unit 500 to dissipate heat generated from the light source 600, and a holder 700 for coupling the light source 600 and heat dissipation unit to the housing 400.

The housing 400 includes a socket connection part 410 connected to an electric socket (not shown), and a body part 420 connected to the socket connection part 410. The light source 600 is received in the body part 420. A plurality of air holes 430 may be formed through the body part 420.

Although a plurality of air holes 430 are formed through the body part 420 of the housing 400 in the illustrated case, a single air hole 430 may be formed through the body part 420. Although the plural air holes 430 are circumferentially arranged, various arrangements thereof may be possible.

The light source 600 includes a circuit board 610 and a plurality of light emitting device modules 650 mounted on the circuit board 610. Here, the circuit board 610 may be shaped to be fitted in an opening formed at the housing 400. Also, the circuit board 610 may be made of a material having high thermal conductivity so as to transfer heat to the heat dissipation unit 500, as will be described later.

The holder 700 is disposed under the light source 600. The holder 700 includes a frame and air holes. Although not shown, an optical member may be disposed under the light source 600 so as to diffuse, scatter or converge light projected from the light emitting device modules 650 of the light source 600.

The above-described lighting apparatus, which employs the above-described light emitting device modules according to one of the above-described embodiments, exhibits an improvement in brightness because it is possible to reduce the amount of light absorbed into the insulating layer of each light emitting device module after being emitted from the corresponding light emitting device. Also, since the distance between each of the first conductive layer (lead frame) and the light emitting device in each light emitting device module is appropriate, it may be possible to reduce the cost of materials used in wire boding and to secure convenience in the manufacturing process.

Figure 14:
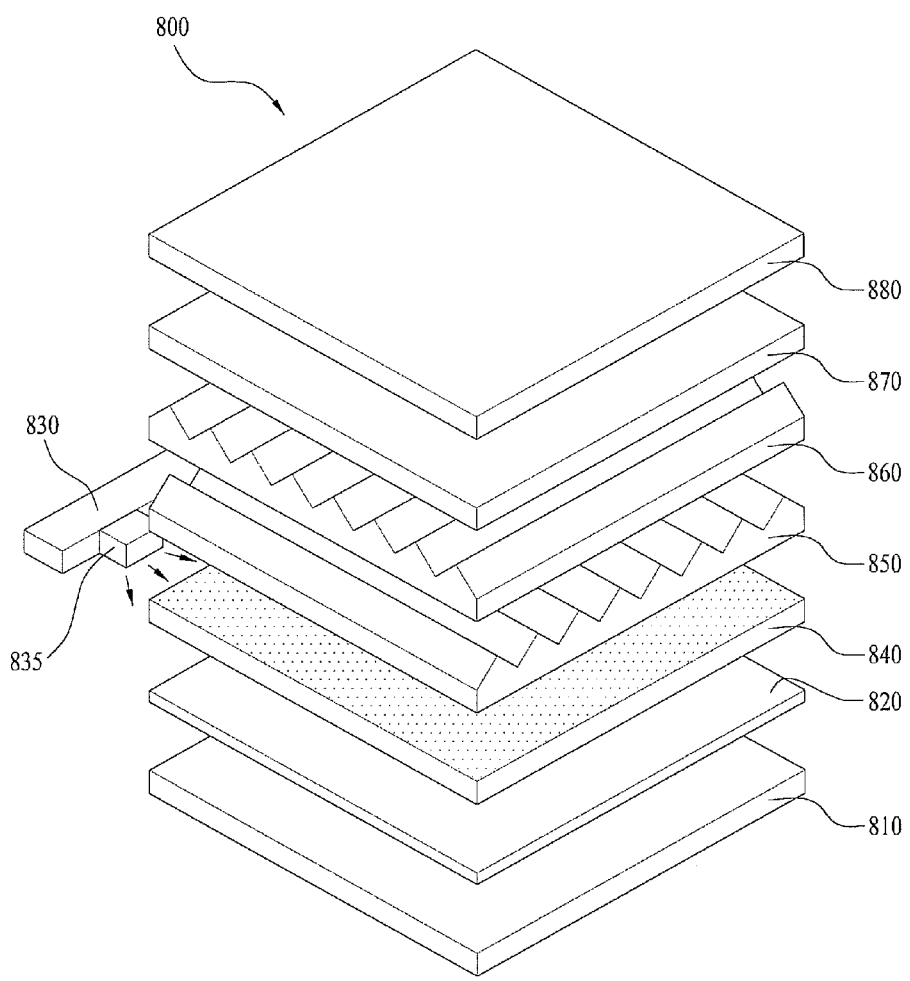
FIG. 14 is a view illustrating a display apparatus including the light emitting device module according to one of the above-described embodiments.

FIG. 14 is a view illustrating a display apparatus including the light emitting device module according to one of the above-described embodiments.

As shown in FIG. 14, the display apparatus according to the illustrated embodiment, which is designated by reference numeral 800, includes a light source module, a reflective plate 820 provided on a bottom cover 810, a light guide plate 840 disposed in front of the reflective plate 820 to guide light emitted from the light source module 830 to a front side of the display apparatus 800, first and second prism sheets 850 and 860 disposed in front of the light guide plate 840, a panel 870 disposed in front of the second prism sheet 860, and a color filter 880 disposed in front of the panel 870.

The light source module includes a circuit board 830 and light emitting device modules 835 mounted on the circuit board 830. Here, a printed circuit board (PCB) may be used as the circuit board 830. The light emitting device module 835 may have the above-described configuration.

The bottom cover 810 serves to receive the constituent elements of the display apparatus 800. The reflective plate 820 may be provided as a separate element, as shown in FIG. 14, or may be provided as a material having high reflectivity is coated over a rear surface of the light guide plate 840 or a front surface of the bottom cover 810.

Here, the reflective plate 820 may be made of material having high reflectivity and capable of being formed into an ultra thin structure. Polyethylene terephthalate (PET) may be used for the reflective plate 820.

The light guide plate 840 serves to scatter light emitted from the light source module so as to uniformly distribute the light throughout all regions of a liquid crystal display apparatus. Therefore, the light guide plate 840 may be made of a material having high refractivity and transmissivity. The material of the light guide plate 840 may include polymethylmethacrylate (PMMA), polycarbonate (PC) or polyethylene (PE).

The first prism sheet 850 may be formed by coating with a polymer exhibiting light transmittance and elasticity over one surface of a base film. The first prism sheet 850 may have a prism layer having a plurality of three-dimensional structures in the form of a repeated pattern. Here, the pattern may be a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light module and the reflective sheet 820 toward the entire surface of the panel 870.

Although not shown, a protective sheet may be provided on each of the prism sheets 850 and 860. The provision of the protective sheet may be achieved by forming a protective layer including light-diffusing particles and a binder at each surface of the base film in each of the prism sheets 850 and 860.

The prism layer may be made of a polymer selected from the group consisting of polyurethane, styrene-butadiene copolymer, polyacrylate, polymethacrylate, polymethyl methacrylate, polyethyleneterephthalate elastomer, polyisoprene and polysilicon.

Although not shown, a diffusion sheet may be disposed between the light guide plate 840 and the first prism sheet 850. The diffusion sheet is made of a polyester or polycarbonate-based material. The diffusion sheet may maximally increase a light projection angle through refraction and scattering of light incident from the display apparatus.

The diffusion sheet may include a support layer including a light diffusing agent, and first and second layers formed on a light emitting surface (in the direction of the first prism sheet) and a light incident surface (in the direction of the reflective sheet) The first and second layers do not include a light diffusing agent.

The support layer may include 0.1 to 10 parts by weight of a siloxane-based light diffusing agent having an average particle size of 1 to 10 μm and 1 to 10 parts by weight of an acryl-based light diffusing agent having an average particle size of 1 to 10 μm, based on 100 parts by weight of a resin including a mixture of a methacrylate-styrene copolymer and methacrylate methyl-styrene copolymer.

The first and second layers may include 0.01 to 1 part by weight of an ultraviolet absorbing agent and 0.001 to 10 parts by weight of an antistatic agent, based on 100 parts by weight of a methacrylate methyl-styrene copolymer resin.

The support layer of the diffusion sheet has a thickness of 100 to 10,000 μm. Each layer may have a thickness of 10 to 1,000 μm.

In the illustrated embodiment, the optical sheet may include a combination of the diffusion sheet, the first prism sheet 850 and the second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The display panel 870 is configured such that a liquid crystal layer is located between glass substrates, and polarizing plates are mounted on both glass substrates so as to utilize polarizing properties of light. Here, the liquid crystal layer has properties between a liquid and a solid. That is, in the liquid crystal layer, liquid crystals which are organic molecules having fluidity like the liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel.

The color filter 880 is provided on the front surface of the panel 870, and transmits only an R, G or B light component of light projected from the panel 870 per pixel, thereby displaying an image.

The above-described lighting apparatus, which employs the above-described light emitting device modules according to one of the above-described embodiments, exhibits an improvement in brightness because it is possible to reduce the amount of light absorbed into the insulating layer of each light emitting device module after being emitted from the corresponding light emitting device. Also, since the distance between each of the first conductive layer (lead frame) and the light emitting device in each light emitting device module is appropriate, it may be possible to reduce the cost of materials used in wire boding and to secure convenience in the manufacturing process.

In the light emitting device module according to one of the embodiments of the present invention and the lighting system using the light emitting device, the insulating layer, which includes a polyimide film, is opened at the top of the cavity. Accordingly, the amount of light absorbed into the insulating layer after being emitted from the light emitting device is reduced, so that an enhancement in optical efficiency is achieved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device module comprising:
   a substrate having substantially a same pattern at an upper surface and a lower surface;
   a heat conductor disposed on the substrate, the heat conductor having a cavity formed in at least a portion of the heat conductor;
   first conductive layer and second conductive layer over the heat conductor;
   an insulating layer between the heat conductor and at least one of the first or second condutive layers, wherein the first conductive layer and the second conductive layer are electrically separated from each other; and
   at least one light emitting diode electrically connected to the first conductive layer and the second conductive layer, wherein the at least one light emmitting diode is thermally coupled to an exposed portion of the heat conductor, wherein:
   the cavity includes a bottom portion and a side wall, and
   a thickness of the heat conductor at a first location corresponding to the bottom portion of the cavity is substantially equal to a thickness of the heat conductor at a second location that corresponds to a portion of the heat conductor outside the cavity, and
   wherein at least one of the first conductive layer or the second conductive layer extends from an edge of the cavity to the side wall of the cavity and then to a portion of the bottom portion, the at least one light emitting diode is disposed on the bottom portion of the cavity in the heat conductor, and the at least one light emitting diode is electrically connected to at least one of the first conductive layer or the second conductive layer by wire in the cavity, and a protrusion is provided at a position at the surface of the substrate that is coupled to the heat conductor, and wherein a depression is provided at an opposite surface of the substrate.

2. The light emitting device module according to claim 1, wherein at least one portion of the heat conductor contacts the protrusion of the substrate and another portion of the heat conductor contacts the substrate.

3. The semiconductor light emitting device module according to claim 1, wherein at least a portion of a cross-sectional area of the protrusion is greatest in a side closest to the substrate.

4. The light emitting device module according to claim 1, further comprising:
   at least one circuit board disposed on the heat conductor and the at least one circuit board corresponds to the protrusion.

5. The light emitting device module according to claim 4, wherein the heat conductor is located between the circuit board and the substrate.

6. The light emitting device module according to claim 1, wherein the protrusion supports the heat conductor at a point that is in alignment outside the cavity.

7. The light emitting device module according to claim 6, further comprising at least two protrusions, wherein each of the at least two protrusions support the heat conductor at corresponding regions of outside of the cavity.

8. The light emitting device module according to claim 1, wherein the protrusion has substantially a trapezoidal shape.

9. A light emitting device module comprising:
a heat conductor having a cavity formed in at least a portion of the heat conductor;
at least one support for supporting the heat conductor at a location that does not correspond to the cavity, the at least one support partially supporting the heat conductor;
first conductive layer and second conductive layer coupled to the heat conductor;
an insulating layer between the heat conductor and at least one of the first or second conductive layers, wherein the first conductive layer and the second conductive layer are electrically separated from each other, and wherein a surface of the insulating layer is exposed at a location where the first conductive layer is separated from the second conductive layer or a location corresponding to an exposed portion of the heat conductor;
at least one light emitting diode electrically connected to the first conductive layer and the second conductive layer, wherein the at least one light emitting diode is thermally coupled to the heat conductor;
at least one circuit board is coupled to the heat conductor, wherein the circuit board corresponds to the at least one support and wherein the heat conductor is located between the at least one circuit board and the at least one support, wherein at least one of the first conductive layer or the second conductive layer extends from an edge of the cavity to the side wall of the cavity and then to a portion of the bottom portion, the at least one light emitting diode is disposed one the bottom portion of the cavity in the heat conductor, and the at least one light emitting diode is electrically connected to at least one of the first conductive layer or the second conductive layer by wire in the cavity; and
a substrate,
wherein the at least one support disposed on a surface of the substrate, and
wherein at least one portion of the heat conductor contacts the support and no other portion of the heat conductor contacts the substrate.

10. The light emitting device module according to claim 9, further comprising at least two supports to support the heat conductor in corresponding regions that do not correspond to the cavity.

11. The light emitting device module according to claim 9, wherein the support includes a heat transfer layer and wherein the heat transfer layer includes a heat conductive material and an adhesive material.

12. The light emitting device module according to claim 9, wherein the support and the substrate are formed as one body, and
wherein the substrate has substantially a some pattern at an upper surface and a lower surface.

13. A lighting system comprising:
a semicondutor light emitting device module including:
a substrate having substantially a same pattern at an upper surface and a lower surface;
a heat conductor disposed on the substrate, the heat conductor having a cavity formed in at least a portion of the heat conductor;
first conductive layer and second conductive layer over the heat conductor;
and insulating layer between the heat conductor and at least one of the first or second conductive laters, wherein the first conductive layer and the second conductive layer are electrically separated from each other; and
at least one light emitting diode electrically connected to the first conductive layer and the second conductive layer, wherein the at least one light emitting diode is thermally coupled to an exposed portion of the heat conductor, wherein the cavity includes a bottom portion and a side wall, wherein a thickness of the heat conductor at a first location corresponding to the bottom portion of the cavity is substantially equal to a thickness of the heat conductor at a second location that corresponds to a portion of the heat conductor outside the cavity, wherein at least one of the first conductive layer or the second conductive layer extends from an edge of the cavity to the side wall of the cavity and then to a portion of the bottom portion, the at least one light emitting diode is disposed on the bottom portion of the cavity in the heat conductor, and the at least one light emitting diode is electrically connected to at least one of the first conductive layer or the second conductive layer by wire in the cavity;
a circuit board for supplying current to the semiconductor light emitting device module; and
an optical transmitter to transmith light emitted for the semiconductor light emitting device module,
wherein a protrusion is at a position at the surface of the substrate that is coupled to the heat conductor and a depression is at an opposite surface of the surface.

14. The lighting system according to claim 13, wherein:
the substrate is or is coupled to a bracket; and
the optical transmitter includes a light guide plate included in or coupled to a backlight.

15. The lighting system according to claim 13, wherein:
the substrate is or is coupled to a bracket; and
the bracket is thermally coupled to a heat dissipator included in or coupled to a lighting apparatus.

* * * * *